United States Patent [19]

Patrick et al.

[11] Patent Number: 4,720,679
[45] Date of Patent: Jan. 19, 1988

[54] MAGNETIC RESONANCE IMAGING WITH PHASE ENCODED CHEMICAL SHIFT CORRECTION

[75] Inventors: John L. Patrick, Solon; E. Mark Haacke, University Heights; Nagarjuna R. Linga, Richmond Heights; Janice E. Hahn, Solon, all of Ohio

[73] Assignee: Picker International, Inc., Highland Heights, Ohio

[21] Appl. No.: 815,381

[22] Filed: Dec. 31, 1985

[51] Int. Cl.$^4$ ............................................. G01R 33/20
[52] U.S. Cl. .................................. 324/309; 324/312; 324/320
[58] Field of Search ............... 324/307, 309, 312, 320; 128/653

[56] References Cited

U.S. PATENT DOCUMENTS

| | | | |
|---|---|---|---|
| 4,581,582 | 4/1986 | Redington | 324/309 |
| 4,585,992 | 4/1986 | Maudsley et al. | 324/309 |
| 4,585,993 | 4/1986 | Bottomley | 324/309 |
| 4,591,789 | 5/1986 | Glover et al. | 324/309 |
| 4,628,262 | 12/1986 | Maudsley | 324/309 |

OTHER PUBLICATIONS

B. R. Rosen, "Applications of Proton Chemical Shift Imaging", SMRM Abstract, pp. 636–638 (1984).
W. T. Dixon et al., "Using the Chemical Shift Difference Between Water & Lipid in Proton Imaging", RSNA Abstract, p. 65 (1984).
D. D. Blatter et al., "Proton Chemical Shift Imaging by Temporarily Asymmetric Spin–Echo", RSNA Abstract, pp. 65–66 (1984).
K. Sekihara, "A New Method of Measuring Static Field Distribution Using Modified Fourier NMR Imaging", The Inst. Phys., pp. 224–227, (1985).
W. T. Dixon, "Proton Spectroscopic Imaging DT 0.35T", SMRM Abstract, pp. 193–194 (1984).
D. Faul et al., "Quick Measurement of Magnetic Field Variations in the Body", RSNA Abstract, pp. 303–304, (1984).
K. Sekihara, "Image Restoration from Non-Uniform Magnetic Field Influence in Direct Fourier NMR Imaging", Phys. Med. Biol., vol. 29, No. 1, pp. 15–24 (1984).
W. T. Dixon, "Simple Proton Spectroscopic Imaging", Biology, pp. 189–194 (1984).

Primary Examiner—Stewart J. Levy
Assistant Examiner—Kevin D. O'Shea
Attorney, Agent, or Firm—Fay, Sharpe, Beall, Fagan, Minnich & McKee

[57] ABSTRACT

A shimming magnetic field control (22) causes shimming magnetic fields for improving uniformity of a main magnetic field generated by main magnets (10). A resonance excitation control (32) selectively applies a resonance excitation pulse (34) and inversion pulse (36) for inverting the spin magnetization of water and lipid dipoles. A phase sensitive detector (30) selectively receives resonance signal components which are transformed by a transform algorithm (70) into a real image (72) and an imaginary image (74). The inversion pulse (36) is shifted by a time such that the water and lipid spin magnetizations are out of phase by a predetermined amount. With a 90° phase difference, the real image represents water and the imaginary represents lipid. A phase image (80) is derived from a reference image pair (76, 78). A phase unwrap circuit (82) removes ambiguities attributable to the spin magnetizations becoming dephased by multiples of $2\pi$ to create a phase map (84). A shim adjustment circuit (94) measures uniformity of the phase map and causes the shim field control circuit (22) to adjust the shimming magnetic fields to optimize the measured uniformity. The phase map is inversely transformed (100) to generate a field map (102) indicative of geometric distortion. A geometric distortion correction circuit (106) selectively interpolates values in the real and imaginary images in accordance with the field map to correct the image for geometric distortion.

49 Claims, 7 Drawing Figures

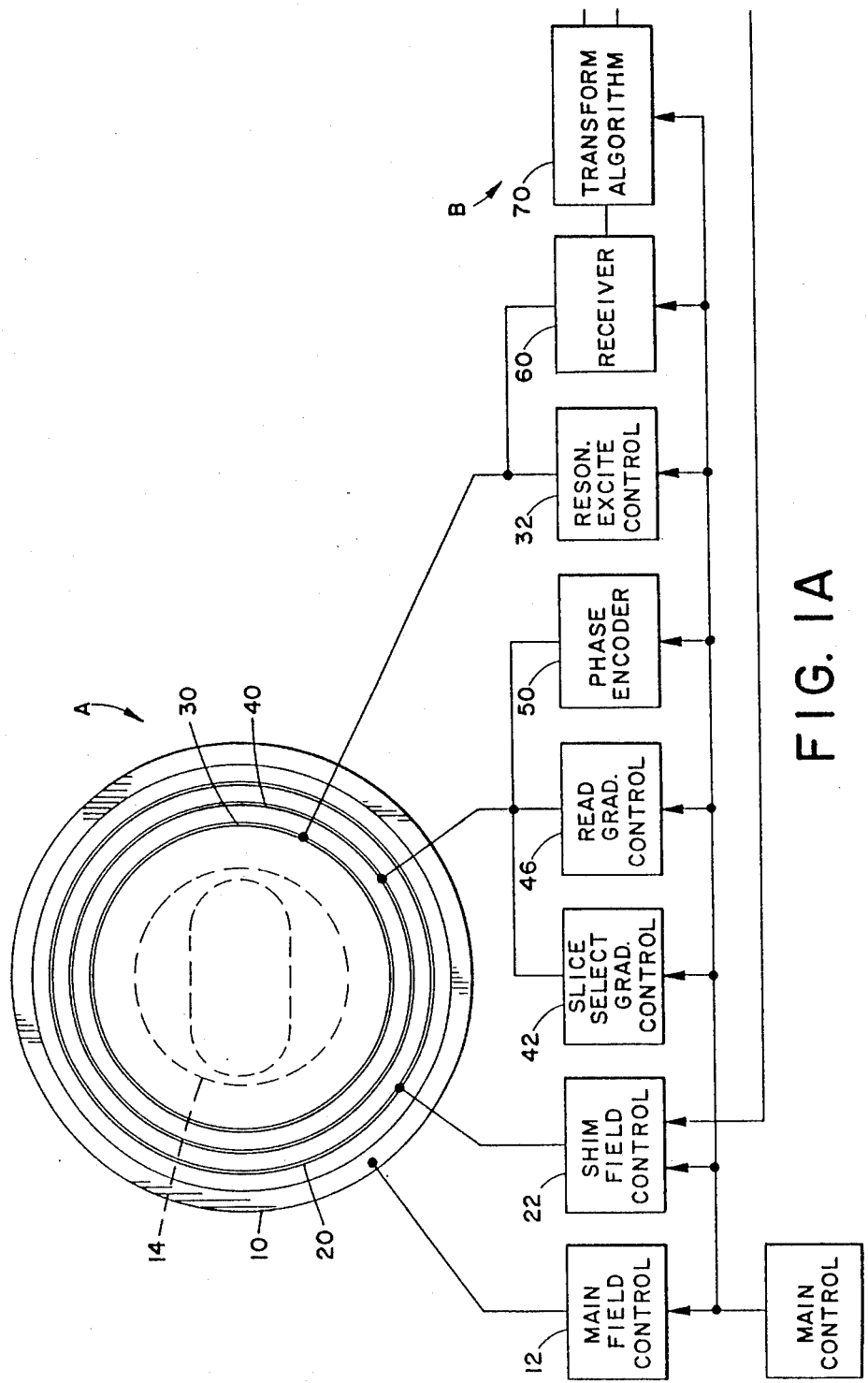

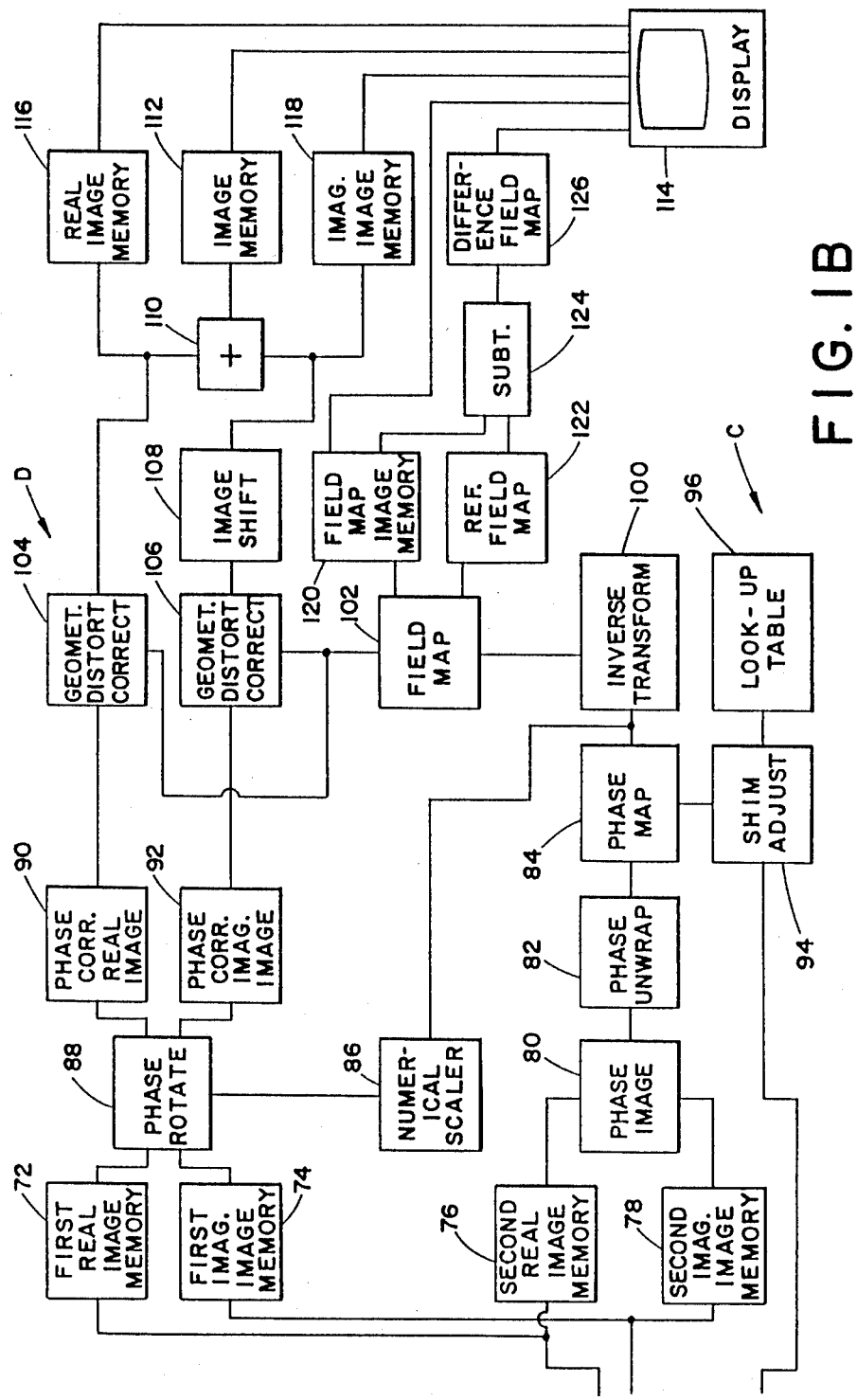
FIG. IB

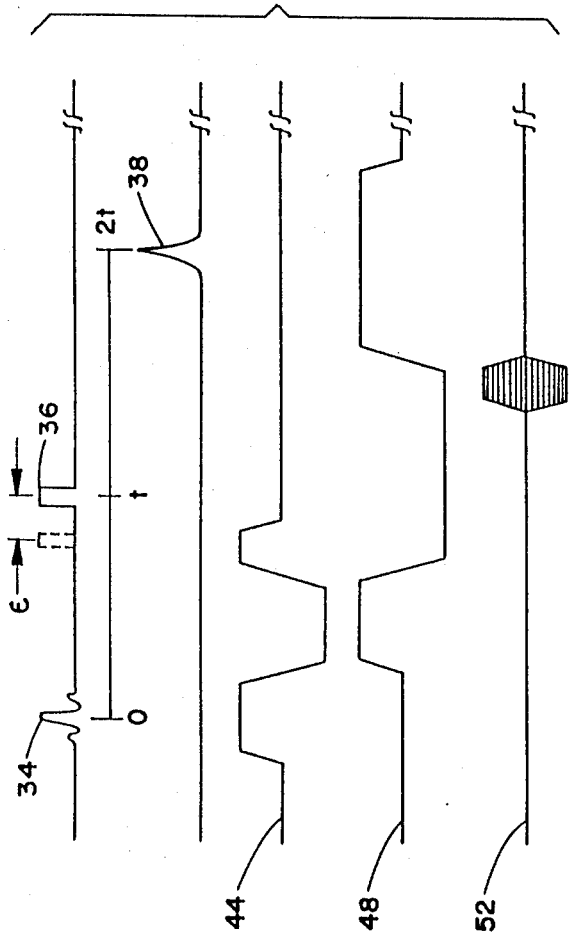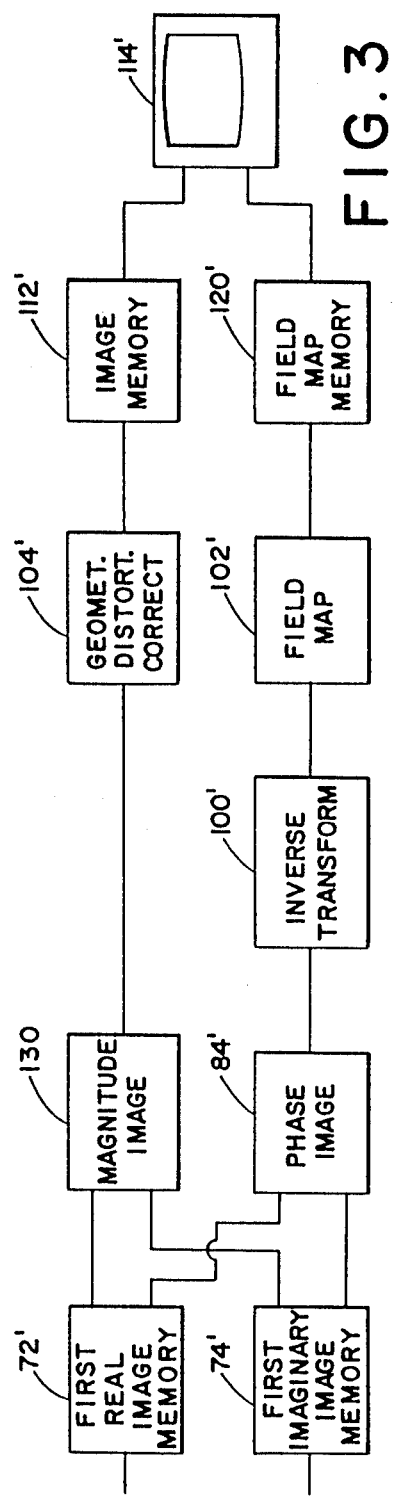

MAGNETIC RESONANCE IMAGING WITH PHASE ENCODED CHEMICAL SHIFT CORRECTION

BACKGROUND OF THE INVENTION

The present invention relates to the art of magnetic resonance imaging. The invention is particularly applicable to the imaging of resonating hydrogen dipoles which are bound in part in water molecules and in part in lipid molecules and will be described with particular reference thereto. It is to be appreciated, however, that the present invention is applicable to correcting other types of images, creating images from other nuclei and the like. These concepts may also be utilized to perform other applications of chemical shift imaging where more than two shift species are important. This technique also produces a characterization of the magnetic field within a subject which may be used for spectroscopic corrections, shimming and the like.

When imaging human patients, hydrogen dipoles commonly present in water, lipid, and other molecules are in the image region. The gyromagnetic ratio of the hydrogen dipoles bound in water differs from the gyromagnetic ratio of hydrogen dipoles bound in lipids. This causes the lipid and water dipoles to precess at different resonance frequencies. This frequency difference causes corresponding errors in the image, such as a shifting of lipid information relative to water, blurring of the image, and the like.

Various techniques for water and lipid separation have been implemented, including selective saturation, multiple quantum, relaxation rate, and alternative chemical shift based techniques. In selective saturation techniques, radio frequency excitation signals are broadcast at separate frequencies. One corresponds to water and the other corresponds to lipid. Either the water or the lipid is selectively excited to saturation and the other is imaged conventionally.

The multiple quantum techniques relay upon the strong multiple quantum coherence between energy states of lipid molecules. The quantum coherence between energy states can be indirectly detected without interference from the single quantum water signals.

The relaxation rate techniques exploit the differences between water and lipid spin-spin or spin-lattice relaxation rates. In an inversion recovery sequence, the inversion time is chosen such that the lipid contributions are placed at the crossover point when the 90° excitation pulse is applied. The net magnetization from the lipid is now zero so that the lipid contribution to the final image is nulled.

In normal spin-echo imaging, a resonance excitation pulse is applied to incite resonance in the hydrogen dipoles. Because the water and lipid dipoles are resonating at different frequencies, the resonance signal therefrom progressively dephase, i.e. become more out of phase. A 180° inversion pulse is applied to reverse the spin direction such that the magnetic resonance signals begin to rephase, i.e. converge back together. The components come back into phase to produce an echo at a time interval after the inversion pulse which is equal to the timer interval between the excitation and inversion pulses. The signal is monitored started before the echo and continuing after the echo and transformed into an image representation.

Shifting the inversion pulse in time by a preselected duration corresponding to one quarter of the inverse of the lipid resonance frequency renders the water and lipid magnetization vectors 180° out of phase during the sampling. Alternatively, the 90° excitation pulse could be moved by twice this amount. However, if this is done, the effective TE of the experiment is changed. The corresponding normal experiment must be adjusted to reflect this effective TE. The image with the unshifted inversion pulse, i.e. the water and lipid vectors in phase, represents the sum of the water and fat magnetization. The image with the shifted inversion pulse, i.e. the water and lipid vectors 180° out of phase, represents the difference between the water and fat magnetization. The sum and difference images each have medical diagnostic utility. Moreover, by summing or subtracting these two images, images of water only or fat only may be extracted.

The magnetic field of a magnetic resonance spectrometer is conventionally shimmed to improve the uniformity of the magnetic field. In one shimming technique, the magnetic field is manually or automatically adjusted until the distortion or the phase variation in an image of a phantom is minimized indicating an optimal field uniformity. In another technique, a magnetometer is positioned at a plurality of preselected locations in the image region and the strength of the maagnetic field measured. The field was selectively shimmed for greater uniformity.

The prior art techniques have various disadvantages such as ambiguities and inaccuracies in the determined magnetic field values. The shifted phase encoding techniques lack a sufficiently high signal-to-noise ratio for many purposes. They also do not account for patient related magnetic field inhomogeneities, particulalry the magnetic susceptibility of the patient. Further, the prior techniques cannot discriminate between field inhomogeneities and chemically shifted species.

The prior art techniques for magnetic field shimming suffer from various disadvantages. Direct magnetometer readings cannot account for patient magnetic susceptibility. They also offer only information about very gradual, i.e. low frequency component, changes in the field distribution. They are also time consuming and require special hardware for their implementation.

The prior techniques which encode magnetic field information in the magnetic resonance signal suffer from several disadvantages. First, they achieve only marginal signal-to-noise enhancement in the determinations. Second, they involve the utilization of phantoms which not only cannot reflect subject magnetic susceptibility but also contaminate the results with imformation about the phantom susceptibility. Third, the magnetic field representation so created is itself geometrically distorted and not an accurate field representation. Techniques of maximizing the delay time of the free induction delay (FID) performed on the subject or specimens are commonly utilized in high resolution spectroscopy. However, such techniques cannot discriminate chemical shift from magnetic field information. Accordingly, the intrinsic accurary is limited to the amount of chemical shift between water and lipid, approximately 3.5 ppm.

Prior art techniques for water/lipid separation which utilized phase encodement techniques require substantial increases in patient scanning time. Further, the phase encodement techniques are not corrected for magnetic field inhomogeneity problems. This limits their viability to special circumstances and prohibits the whole body utilization. These techniques also involve the utilization of a 180° phase difference between water and lipid which causes ambiguities and cannot be used with inversion recovery scanning techniques.

The present invention contemplates a new and improved image encodement and reconstruction technique which overcomes the above reference disadvantages and others.

SUMMARY OF THE INVENTION

In accordance with one aspect of the present invention, a method of magnetic resonance imaging is provided. Magnetic resonance is excited in water and lipid dipoles of an image region such that magnetic resonance signal components are generated. The spin magnetization of the resonating dipoles is inverted. Proximate to a first echo, the magnetic resonance signal components are collected. The collected magnetic resonance signal components are transformed into pixel values. The pixel values are separated into a water image and a lipid image In accordance with one more limited aspect of the invention, water and lipid values which are intermixed after the transform are separated in accordance with measured relaxation parameters. In accordance with another more limited aspect, the resonance signals are collected with the water and lipid spin magnetizations 90° out of phase such that a two dimensional Fourier transform transforms the resonance signal components directly into water and lipid images.

In accordance with another aspect of the present invention, a method of magnetic resonance imaging is provided. Magnetic resonance is excited in water and lipid dipoles in an image region such that magnetic resonance signal components are generated. A field map which is indicative of magnetic field inhomogeneities in the image region is created through a phase encodement and inverse transform procedure. The resonance signal components are transforemd into a first image corresponding to water dipole generated resonance signal components and a second image corresponding to lipid dipole generated resonance signal components. The images are geometrically corrected in accordance with the field map. In this manner, the images are corrected for geometric distortion which is attributable to magnetic field non-uniformities such as those caused by static, gradient, and local field inhomogeneities, inhomogeneities of the magnets, and the like.

In accordance with another aspect of the present invention, a method and apparatus for magnetic resonance imaging are provide. A main magnetic field is generated longitudinally through an image region. A radio frequency excitation pulse is applied for exciting magnetic resonance of at least water and lipid dipoles in the image region. Because the water and lipid dipoles resonate at different frequencies, the magnetizations thereof progressively dephase. An inversion pulse is applied to reverse the spin direction such that the dephasing dipoles commence rephasing. The point in time at which the inversion pulse is applied is selected to yield a preselected phase relationship between water and lipid at the center of a data acquisition interval. Magnetic field gradients are applied across the image region for encoding spatial position of resonating dipoles within the image region. Resonance signal components from the rephasing dipoles are phase sensitively detected. The detected signal components are transformed into real and imaginary images, one of which corresponds to the water dipoles and the other of which corresponds to the resonating lipid dipoles.

In accordance with another aspect of the invention, a method of magnetic resonance imaging is provided. Magnetic resonance is excited in dipoles in an image region. The resonance is spatially encoded such that spatial position encoded magnetic resonance signal components are generated. The spatially encoded resonance signal components are transformed into an image representation which includes columns and rows of complex image values. Each complex value may be represented with separate phase and magnitude components. The phase components in each row or column are examined for discontinuous phase changes of $\pm 2\pi$. The phase component of all image values from each phase discontinuity to one end of the column or row are changed by $\pm 2\pi$. In this manner, ambiguities attributable to phase wrapping are resolved.

In accordance with another aspect of the present invention, a method of magnetic resonance imaging is provided. A generally uniform main magnetic field is generated through an image region. Shimming magnetic fields are generated in the image region to increase the uniformity of the main magnetic field. Magnetic resonance dipoles in the image region are excited and magnetic resonance signal components are generated. The resonance signal components are spatially encoded and the spatially encoded components are transformed into a phase image representation. Uniformity of at least a preselected portion of the phase image representation is measured. The shimming magnetic fields are adjusted to optimize the measured image uniformity.

In accordance with another aspect of the present invention, a method of determining the magnetic susceptibility of a patient is provided. Magnetic resonance is excited in an image region without a patient present such that magnetic responance signal components are generated. The magnetic resonance signal components are spatially encoded and transformed into image representations. A phase map is derived from the image representations and inversely transformed to create a reference field map. The process is repeated with a patient in the image region to create a patient field map. The patient and reference field maps are subtracted to create a difference field map which is indicative of the patient's magnetic susceptibility.

In accordance with another aspect of the present invention, a method of magnetic resonance imaging is provided. A magnetic resonance excitation pulse is applied followed by a first inversion pulse a time $t \pm \epsilon$ later. Magnetic resonance signals are collected around a first echo about a time 2t after the excitation pulse. A second inversion pulse is applied about a time 3t after the excitation pulse. Thereafter, magnetic resonance signals are collected around a second echo about a time 4t after the excitation pulse. The excitation, inversion, and data collection are performed with $\epsilon = 0$ to generate magnetic resonance signals that are transformed into first and second image pairs, respectively. The excitation, inversion, and data collection steps are performed again with $\epsilon = n\pi$, where n is not zero or an even integer. In the preferred embodiment, n=1 data collected around the first echo is transformed into a third image pair and data collected during the second echo is transformed into a fourth image pair. Magnitude and phase images are derived corresponding to each of the four image pairs. The magnitude images corresponding to signals collected during the first echo are added to generate a first echo dominant image and subtracted to generate a first echo subdominant image. Analogously, the magnitude images from data collected during the second echoes are added to create a second echo dominant image and subtracted to create a second echo subdominant image.

In accordance with a more limited aspect, a relaxation parameter image is derived by taking the ratio of corresponding pixels of the first and second echo dominant images. A second relaxation parameter image is created by determinining a ratio of corresponding pixels of the first and second echo subdominant images. The T2 relaxation time is readily computed from these ratios.

In accordance with a more limited aspect, the T2 relaxation rate information derived separately for the dominant and subdominant images is utilized to re-sort these dominant and subdominant images into water and lipid separated images. The T2 value associated with lipied is fairly distinct from those corresponding to non-lipid values. At each pixel either the dominant or subdominant T2 value will be closer to a preassigned lipid T2 value and will be assigned as lipid, the other as water. This predetermined value of T2 may be assigned from prior information or a combination of prior information and histogram or other techniques which make use of the determined T2 value population distribution.

In accordance with one aspect of the present invention, a method of magnetic resonance imaging is provided. The spin magnetization is first inverted (inversion recovery technique). At a later temporal point, magnetic resonance is excited in water and lipid dipoles of an image region such that magnetic resonance signal components are generated. The spin magnetization of the resonating dipoles is inverted. Approximate to the echo formation, the magnetic resonance signal components are collected. The collected magnetic resonance signal components are transformed into pixel values. In a similar manner, additional signal components are collected from an additional experiment in which the latter inversion is delayed by a time t such that the water and lipid dipoles are placed in a predetermined phase relationship. The preferred embodiment assigns this phase difference to be $\pi$ radians. Two additional signal collections are acquired from two additional experiments identical to those just described. However, no inversion preceeding the excitation pulse is applied. These signal collections are each transformed into image representations consisting of magnitude and phase information. Separated T1 relaxation rate information is derived for each pixel location for forming dominant and subdominant images corresponding to the inversion recovery and normal signal collection. The proper sign of the dominant and subdominant pair corresponding to those scans preceeded by the inversion is restored through a transforming means. Conventional techniques are then applied to the sign corrected dominant and subdominant pairs to obtain T1 values. In accordance with another aspect of the present invention, an apparatus for magnetic resonance imaging is provided. A magnetic resonance excitation means excites magnetic resonance in water and lipid dipoles in an image region such that magnetic resonance signal components are generated. A gradient field means spatially encodes the magnetic resonance signals. A transforming means transforms the spatially encoded resonance signal components into a first image corresponding to water dipole generated resonance signal components and a second image corresponding to lipid dipole generated resonance signal components. A geometric distortion correction means interpolates at least one of the images in accordance with a field map that is indicative of magnetic field inhomogeneities in the image region.

In accordance with another aspect of the present invention, an apparatus for magnetic resonance imaging of water and lipids is provided. A main magnetic field means generates a generally uniform, main magnetic field longitudinally through an image region. A gradient field means selectively applies magnetic field gradients in the image region for spatially encoding resonance signal components. A resonance excitation means selectively applies and excitation radio frequency pulse for exciting magnetic resonance of at least water and lipid dipoles in the image region. Because the water and lipid dipoles resonate at different frequencies, the spin magnetizations thereof progressively dephase. The resonance excitation means further applies an inversion pulse which reverses the spin magnetizations causing the dephasing spin magnetizations to commence rephasing. The inversion pulse is applied at a time which is selected such that the water and lipid spin magnetizations have a preselected phase relationship during acquisition of the magnetic resonance signal components. A phase sensitive detection means detects the resonance signal components. A transforming means transforms the detected resonance signal components into real and imaginary images. One of the images corresponds to resonance signals generated by water dipoles and the other image corresponds to resonance signal components generated by the lipid dipoles.

In accordance with yet another aspect of the present invention, an apparatus for magnetic resonance imaging is provided. A magnetic resonance excitation means excites resonance in dipoles in an image region such that magnetic resonance signal components are generated. A transforming means transforming magnetic resonance signal components into at least a first image representation. A phase unwrapping means adjusts the phase of complex image values of the first representation by multiples of $2\pi$ to remove phase discontinuities attributable to dephasing of the spin magnetizations of water and lipid dipoles by multiples of $2\pi$.

In accordance with yet another aspect of the present invention, a magnetic resonance imaging apparatus is provided. A main magnetic field means generates a generally uniform, main magnetic field longitudinally through an image region. A shimming magnetic field means selectively generates shimming magnetic fields in the image region to increase the uniformity of the main magnetic field. A magnetic resonance excitation means selectively excites magnetic resonance of selected dipoles in the image region such that magnetic resonance signal components are generated. A gradient field means spatially encodes the magnetic resonance signals. A transforming means transforms the spatially encoded magnetic resonance signal into an image representation having phase and magnitude components for temporary storage in an image memory. An automatic shim adjusting means measures uniformity of at least a preselected portion of the image representation phase components and automatically adjusts the shimming magnetic field means to optimize the measured phase uniformity.

One advantage of the present invention is that it is applicable for whole body water-lipid separation by correcting for magnetic field and other problems which heretofore prohibited water/lipid separation over a large area.

Another advantage of the present invention is the extraction of magnetic susceptibility information about subject tissue through whole body imaging techniques. This allows possible tissue characterization and the like.

Another advantage of the present invention is the extraction of the total magnetic field distribution within the subject from magnetic resonance scans with reference to field mapping techniques.

In accordance with this latter aspect of the invention, whole body water/lipid separation is achieved which can be utilized with inversion recovery scanning techniques.

In accordance with another aspect of the invention, whole body water/lipid separation is achieved which, either directly or with appropriate corrections, provides relaxation rates, T1 and T2 and density information separately for the water/lipid species.

In accordance with another aspect of the invention T2 relaxation rate information now separately available for water and lipid is used to discriminate water dominant from fat dominant regions. This relaxation rate information can be obtained through the use of CPMG techniques which would, in general, not require additional patient scanning time.

In accordance with another aspect of the invention, information about magnetic field distribution within the subject is obtained without additional patient scanning time.

In accordance with another aspect of the invention, the differing resonance frequencies of hydrogen spins due to magnetic field variations are separated from those due to chemical shift.

Another advantage of the present invention is that it corrects for magnetic susceptibility of and within the patient. The correction may be applied to the resultant image or through shimming adjustments to the main magnetic field. Moreover, geometric distortion is corrected.

In accordance with yet another aspect of the present invention, reduced scanning times are achieved. The shorter scanning times not only improve efficiency of machine utilization but reduce motion related problems.

Still further advantages will become apparent to those of ordinary skill in the art upon reading and understanding the following detailed description of the preferred embodiment.

BRIEF DESCRIPTION OF THE DRAWINGS

The invention may take form in various steps and arrangements of steps and in various components and arrangements of components. The drawings are only for purposes of illustrating a preferred embodiment and are not to be construed as limiting the invention.

FIGS. 1A and 1B taken together are a diagrammatic illustration of a magnetic resonance apparatus in accordance with the present invention;

FIG. 2 is a diagrammatic illustration of pulse sequences for exciting magnetic resonance in accordance with the present invention.

FIG. 3 is a diagrammatic illustration of an alternative embodiment to the image processing apparatus of FIG. 1B;

DETAILED DESCRIPTION OF THE PREFERRED EMBODIMENT

Figure 4:
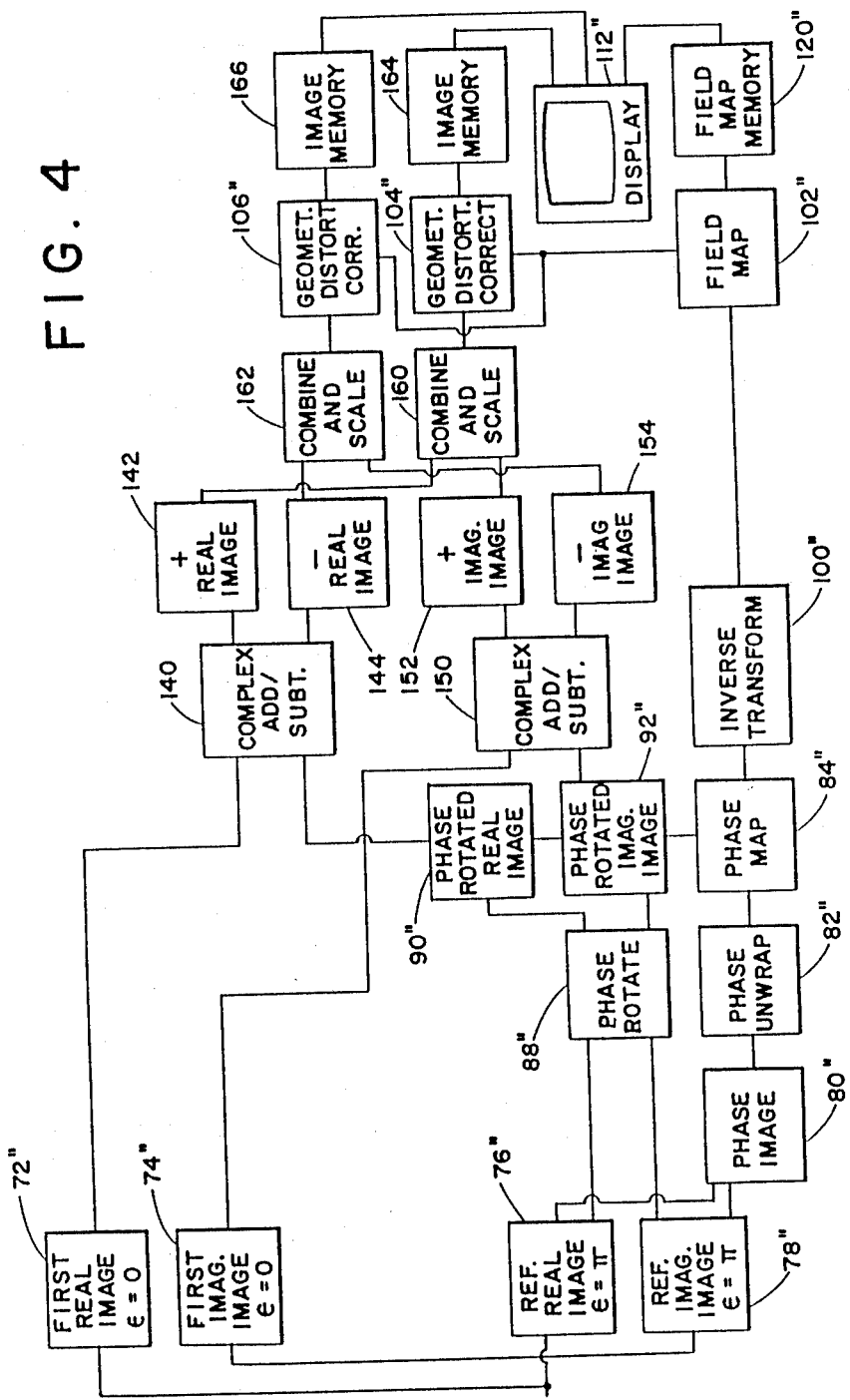
FIG. 4 is a diagrammatic illustration of a two scan alternate embodiment to the apparatus of FIG. 1B for processing image representations.

With reference to FIGS. 1A and 1B, a magnetic resonance scanner or excitation means A excites magnetic resonance of hydrogen dipoles in water and lipids in an image region such that magnetic resonance signal components are genrated. Optionally, other or additional dipoles may be excited to resonance. A transforming means B transforms resonance signal components into first and second images which correspond to the water, lipids, or different combinations thereof. An automatic shimming means C monitors image phase and automatically adjusts or shims the magnetic field to compensate for magnetic susceptbility changes or variations attributable to a subject in the image region. A correction means D selectively adjusts at least one of the images to correct for magnetic susceptibility, geometric distortion, and the like.

With particular reference to FIG. 1A, the magnetic resonance scanner includes a plurality of magnets 10 and a control circuit 12 therefore. The main magnetics 10 generate a substantially uniform magnetic field longitudinally through an image region 14. Shim coils 20 selectively shim or alter the main magnetic field for greater uniformity within the image region. A shim coil control means 22 selectively applies currents to selected portions of the shim coil to control adjustments to the main magnetic field from the shim coil. The shim control means 22 is adjusted to bring the main magnetic field to preselected characteristics, normally optimum uniformity.

With continuing reference to FIG. 1A and further reference to FIG. 2, a quadrature coil 30 is connected with a resonance excitation control circuit or means 32. The resonance control circuit selectively causes an excitation radio frequency pulse 34 which causes hydrogen dipoles in water, lipids, and the like to precess about their alignment with the main magnetic field. The precession or resonance frequency is proportional to both the gyromagnetic ratio of the dipole and the field strength to which it is subject. A 180° inversion pulse 36 selectively inverts or reverses the direction of precession. Spin magnetization vectors that dephased after the excitation pulse 34 are inverted and commence rephasing. When the rephasing vectors are fully coincident an echo 38 occurs.

To encode spatial position in the dipoles, a gradient coil 40 selectively alters the main magnetic field as a function of spatial position under the control of a gradient control means. The resonance frequency and phase of the water dipoles then vary as a function of spatial position. Commonly, a slice select gradient means 42 selectively encodes one or more slices with a slice select gradient sequence 44. A read gradient means 46 spatially encodes the resonance signal in a first or read gradient direction with a read gradient sequence 48. A phase encoding means or circuit 50 selectively adjusts the gradients to generate a series of phase encoding pulses 52 which cause a phase shift which varies with spatial position. In this manner, the relative phase is encoded in accordance with spatial position along a second or phase encode direction. The frequency $\omega_w$ of resonating water dipoles can be expressed as:

$$\omega_w(x,y,z) = \gamma H(x,y,z) \quad (1)$$

where $\gamma$ is the gyromagnetic ratio of water and $H(x,y,z)$ is the magnetic field.

The lipid can be represented as a chemical shift relative to water. That is, due to the different chemical bonding of the hydrogen atoms in the water and lipid molecules, the hydrogen dipoles in the water precess or resonate at a different frequency than the hydrogen dipoles in the lipid. The angular precession rate or frequency of the lipid may be expressed in terms of an effective magnetic field difference, $H_{cs}$, relative to the water, i.e.:

$$\omega_l(x,y,z) = \gamma(H(x,y,z) + H_{cs}) \quad (2)$$

Between water and lipid, $H_{cs}$ is approximately a 3.5 parts per million shift with respect to H.

In a standard spin-echo protocol, the magnetic spins are aligned along the direction of the main magnetic field, $H_o$. The radio frequency excitation pulse 34 is applied to the system to excite the spin magnetization vectors from their alignment with the main magnetic field into the plane transverse thereto. In a rotating frame of reference which rotates with the same angular velocity as a water dipole in the geometric center of the image region, the spins or magnetization vectors of the other dipoles would be rotating relative thereto at a rate which is proportional to the difference in the magnetic field between the two positions, i.e. the applied gradient magnetic fields. Moreover. the lipid spins would be moving at a different rate attributable to the chemical shift between lipid and water.

This difference in spin rates causes the dephasing of the spin population which increases with time. At a later point in time, t, the inversion or second r.f. pulse 36 is applied which rotates the spins by 180° about the y-axis. This reverses the spin direction such that the spins start refocusing or moving back into alignment. At a pont in time 2t, the spins will refocus, i.e. come back into convergence and the same state as when the excitation pulse 34 was applied along the negative x-axis. Conventionally, the refocusing point or echo 38 is the center of the data acquisition window. Thus, the relative phase of the spins regardless of precessional frequency is zero.

By shifting the inversion pulse 36 in time by an amount $\pm \epsilon$, an encodement $\phi$ of the image occurs in the phase:

$$\phi = \omega \Delta t = \pm 2\gamma \Delta H(x,y,z) \epsilon \quad (3)$$

where $\Delta H(x,y,z)$ represents the effective field inhomogeneity which the spin sees and is a function of space and of spin type, i.e. water or lipid. However, there are other sources contributing to the magnetic field inhomogeneity $\Delta H$ including static and gradient magnetic field variations from magnetic imperfections, patient induced magnetic susceptibility, and chemical shift effects. The field inhomogeneity is then computed as proportional to the phase difference resulting from the modified sequence with a time shifted inversion pulse 36' shifted $\pm \epsilon$ and the non-modified sequence in which $\epsilon = 0$.

This phase encodement may be utilized to discriminate between water and lipid through a variety of implementations. As described above, one prior art technique included taking one scan with $\epsilon$ set to zero and a second scan with $\epsilon$ adjusted such that the phase difference between the water and lipid was approximately 180°, hereinafter denoted as $\epsilon = \pi$. The $\epsilon = 0$ scan, crudely speaking, is composed of the sum of the water and lipid contributions; whereas the 180° phase difference scan is composed of the difference between the water and lipid. Addition and substraction of these two scans would lead to water or lipid images if there were no other quantities than the chemical shift influencing the phase. However, the presence of the magnetic field variations and the like cause phase errors which result in a remixing of the water and lipid contributions in the added and subtracted images.

In an improved two scan method, the magnitude is taken before the addition and subtraction. Recall that in general, each scan produces a real image and an imaginary image. When the magnitude is taken before the addition and subtraction, a water versus lipid image is not created. Rather, the water is separated from the lipid on a pixel by pixel basis. The resultant image which results from this addition contains the contribution in each pixel of either the water or the lipid which ever has the greatest signal strength. The subtraction image contains the one with the smaller signal strength. This technique is advantageous in that it is immune from static magnetic field inhomogeneities. Although separate water vs. lipid images are not generated, the pixel-by-pixel separation is sufficient for many purposes such as computed T2 relaxation times, some aspects of image resolution restoration from the chemical shift artifacts, and the like.

In accordance with another embodiment of the scanning protocol, other, particularly non-zero, choices of $\epsilon$ are made. For example, $\epsilon$ can be chosen in one scan to give a $+\pi/2$ radian phase difference and in the other scan to give a $-\pi/2$ radian phase difference. In yet another two scan embodiment, one scan is conducted with $\epsilon = 0$ radians and another with an $\epsilon$ which produces with a $\pm \pi/2$ radian phase difference. In general, the water and lipid can be separated on the basis of any two different scans by the solution of a set of two equations with two unknowns:

$$I_1(x,y,z) = (\rho_w + \rho_f e^{2i\gamma\epsilon H_{cs}}) e^{2i\gamma\epsilon \Delta H(x,y,z)} \quad (4a)$$

$$I_2(x,y,z) = (\rho_w + \rho_f e^{2i\gamma\epsilon H_{cs}}) e^{2i\gamma\epsilon \Delta H(x,y,z)} \quad (4b)$$

where $\rho_w$ and $\rho_f$ are the two unknowns. Note that if $\Delta H$ is also unknown a third scan can be taken to create three analogous equations in three unknowns. For example, $\epsilon$ may be chosen such that a $0,\pi,2\pi$ radian phase shifts or $0,\pi/2,\pi$ shifts are produced. With the proper choice of $\epsilon$ for two scan separation techniques, $\Delta H$ can be extracted from these two scans without a third. $\Delta H$ can be determined from a scan with $\epsilon = \pi$ or $\epsilon = 2\pi$.

The choice of different $\epsilon$ values past two does not necessarily yield independent equations. Various values of $\epsilon$ may be chosen to solve for $\Delta H$. One optimal three scan choice is $\epsilon = 0, \pi/2, \pi$. The rate of change of phase with $\epsilon$ is observed. For two components, such as water and lipid, these components precess at differing rates. A determination is made whether the dominant species is rotating faster or slower than the subdominant species as a function of $\epsilon$. This provides a unique determination of the relative water/lipid contributions and which one is dominant so that water lipid separated images may be obtained. If only water or lipid exists within a pixel, ambiguities may result. Optionally other choices for $\epsilon$, such as $\epsilon=0$, $\pi$, $2\pi$ may also be made. With this selection for $\epsilon$ one can solve for $\Delta H$ directly, subject to phase wrapping. The additional information necessary to complete separation when $\Delta H$ is unknown may come from different sources than additional $\epsilon$ choices. For example, as discussed below, T2 relaxation information available through CPMG or multi-echo formation may also be utilized along with the magnitude scan technique discussed above.

These techniques require phase unwrapping but work even if water and lipid do not exist together in a pixel. It is to be appreciated that combinations of these techniques may advantageously be employed. Direct solution for $\Delta H$ refers to the fact that the $\epsilon=2\pi$ shift no longer contains phase information from chemical shift and is a direct, although in general, phase unwrapped representation of the magnetic field.

In the preferred embodiment, and $\epsilon$ is selected such that only a single scan is required to separate the water and lipids. Specifically, the $\epsilon$ is selected such that the water and lipids are placed $\pi/2$ radians out of phase with each other. With the phase sensitive detection, the 90° out of phase water and lipid signals are discretely detected by a receiving circuit or means 60.

Optionally, the temporal shift of the 180° inversion pulse 36 may be replaced by a temporal shift of the 90° excitation pulse 34. As another option, the read gradient can be modified to shift the gradient echo point relative to the spin echo.

The transform means B transforms the received signals from a data or Fourier space to image space. In the preferred embodiment, the transform means includes a two dimensional Fourier transform program or means 70. Optionally, other transforms, such as a generalized transform, may be used. The Fourier transform means 70 transforms the received phase sensitive detected resonance signals into an image pair, such as real and imaginary images. The real image components are stored in a first real intermediate or temporary image storage memory 72 and the imaginary components are stored in a first imaginary intermediate or temporary imaginary image memory means 74. When whole body separations are desired, a reference scan or second echo of a CPMG sequence is utilized to obtain phase corrections for magnetic inhomogeneities. This reference scan need not have the same magnetic resonance scan parameters because only phase not magnitude information is utilized. Relaxation rates are thus not important. This allows a minimum of additional patient scanning time. Of course, approximate corrections for field inhomogeneities can be obtained from phantom scans or magnetometer plots if additional patient scanning is not possible or undesirable. The reference scan data is transformed by the transform means 70 into real and imaginary reference image memories 76 and 78. A phase image means 80 derives a phase image from the phase components of the reference image pair.

When phase encoding the precessional rate or magnetic field information, the phase values or components may exceed $2\pi$ due to magnetic field inhomogeneities and the like. Each time the phase difference exceeds $2\pi$ or wraps a full revolution, a phase discontinuity occurs causing an ambiguity. A phase unwrapping means 82 removes this phase ambiguity. Specifically, the phase unwrapping means examines the phase pixel by pixel. In the preferred embodiment, the unwrapping means starts at the center pixel of the image and moves progressively up the center column. Each time a discontinuity, particularly a discontinuous phase change of $\pm 2\pi$ occurs, $2\pi$ is added or subtracted, as necessary to the phase of all pixels between the discontinuity and the outer edge of the column to restore continuity. The other half of the column is processed for continuity changes in a like manner with $2\pi$ being added or subtracted between each discontinuity and the action end of the column. This process is repeated for each column moving progressively outward from the center until all columns have been unwrapped. Then the process is repeated for each row starting at the center and working out. Other unwrapping orders may also be implemented. For example, the image may be unwrapped along other parts through the image in which each point along each path is connected to a central point of the corresponding path.

It is to be appreciated that the phase unwrapping technique is also applicable to conventional inversion recovery imaging techniques. When performing an inversion recovery imaging technique, the resultant phase should equal 0° or 180°. In practice, the spin magnetizations commonly fail to be precisely at 0° and 180° phase. However, the relative phase in a small area will be 0° or 180°. Thus, phase discontinuities of $2\pi$ radians exist locally. A phase mapping means may be provided which searches for phase discontinuities of $2\pi$ radians in columns and rows of the image representations. The final phase of the image may be restored to one with phase of only 0° or 180° eliminating the normally gradual phase errors which could othrwise cause sign ambiguities.

Low signal values at pixels in columns and rows may obscure the phase wrap discontinuity. Small regions of low signal strength are no problem. Until the phase change from the last pixel with adequate signal strength to the next pixel with adequate signal strength exceeds $\pi/2$, no ambiguity results. Although a phase discontinuity may have occurred in the region of lowsignal, the ambiguity within this region may be effectively moved out of the region by keeping track of the phase change. For example, the phase of the last pixel with adequate strength may be rotated to zero. For larger regions of low signal, information from adjacent columns and rows or other selected paths through the image is utilized to find a continuous path of information around this region. Additionally, the multi-scan technique described above can be employed to determine the correct phase at any location where water and lipid both exist. Alternative information from scans of continuous phantoms could also be utilized to overcome these ambiguities.

In this manner, an unwrapped or ambiguity-free phase map representing the magnetic field inhomogeneities is created and stored in a phase map memory 84. A numerical scaling means 86 scales the phase correction pixel by pixel indicated by the phase map 84. Because the reference signal may have values of $\epsilon=n\pi$, scaling may be required for the selected value of n where n optimally is an integer or half integer but may take other values. A real image phase correcting means 88 corrects the phase of the first image pair pixel by pixel in accordance with the phase correction indicated by phase map 84. Phase corrected first real and imaginary images are stored in phase corrected real and imaginary memories 90 and 92, respectively.

The shimming means C corrects for static field inhomogeneities and patient susceptibility. The reference scan is conducted with $\epsilon \neq 0$. The phase is examined at points on the outer boundary of the imaged area, particularly the peripheral signal boundary pixels of the image in the phase map memory 84. This area is usually a lipid boundary. In order to avoid corrections for chemical shift, it is preferable that all measurements be made either all in lipid or all in non-lipid tissue. An automatic shim means 94 interrogates the pixels along the outer boundary of the phase map and compares them for uniformity. The shimming coil control means 22 adjusts the relative amounts of current in the shim coils such that the uniformity of the phases in the monitored pixels is optimized. The process may include a plurality of iterative adjustments. A look-up able 96 is utilized to reduce the number of iterations required for optimization. The look up table is preprogrammed in accordance with the relationship between the shim coil current levels in each region and the corresponding magnetic field alteration. Because this relationship varies with the scanner, the look up table is programmed based on the measured, calculated, or otherwise known parameters of the selected scanner. Alternately, the harmonic content may be deconvolved.

The magnetic field in the image region can be measured in various ways. For example, the magnetic field can be measured at selected locations with a magnetometer and plotted. Alternately, the field information can be obtained by scanning a phantom. The correcting means D includes a means for correcting for magnetic field inhomogeneities. In the two scan techniques, the water and lipid are, in principle, radians out of phase. However, if an additional magnetic field inhomogeneity is present, then the phase of the water and fat in each pixel is rotated by an additional angle:

$$\phi(x,y,z) = 2\gamma(H(x,y,z) - H_o)\epsilon \quad (5)$$

When adding and subtracting the two scans, this magnetic field inhomogeneity prevents separate water and lipid images from being created. Analytically, the situations can be expressed as:

Normal scan $I(x,y,z) \alpha (\rho_w + \rho_f)$ (6a)

Modified scan $I(x,y,z) \alpha (\rho_w - \rho_f) e^{2i\gamma \Delta H(x,y,z)\epsilon}$ (6b)

where I(x,y,z) is the intensity of the resulting image from each scan and is a complex function. The phase problem caused by the magnetic field inhomogeneity $\Delta H$ could be eliminated by taking the magnitude. However, taking the magnitude causes a sign ambiguity in the modified sequence intensity which could be either a negative or positive quantity depending on whether the water or lipid is larger. If there is a knowledge of the field inhomogeneity $\Delta H$ from some source, then the modified sequence results can be rotated by the angle of equation (3). The signal ambiguity occuring when first taking the magnitude can be resolved by refering to T2 relaxation information to resolve the ambiguity.

The reference scan with $\epsilon = n\pi$ need not be run with the same magnetic resonance parameters as the $\epsilon = \pi/2$ scan because only phase not relaxation rate dependent information is necessary. The phase of this scan which is indicative of the field inhomogeneities is unwrapped and transformed to provide such a field map which is indicative of field inhomogeneity. Optionally, limited geometric distortion correction may be had by eliminating the reference scan and deriving the phase and field map from the image pair to be geometrically corrected.

An inverse transform means 100 performs an inverse transform on the pixels of the phase map 84 to derive a field map 102. In the preferred embodiment, the inverse transform is the inverse of a forward transform described in "A New Method of Measuring Static Field Distribution using Modified Fourier NMR Imaging" K. Sekihara, S. Matsui, and H. Kohno, 1985, The Institute of Physics, pages 224–227. The field map 102 indicates the magnetic susceptibility distortions and other magnetic field inhomogeneities at each position in space. The water and lipid images are interpolated in accordance with the distortion indicated in the corresponding field map 102 by a geometric correction or interpolaton means 104, 106. For example, the field map may indicate that the susceptibility distortions have shifted some data by a full pixel; in which case the appropriate data is shifted to the appropriate pixel. The field map may also indicate that the susceptibility distortions have shifted some data by a fraction of a pixel, in which case a weighted averaging of the appropriate data is implemented. The distortion may also cause compression or stretching in accordance with the field map. The image data (pixel values) are then stretched or compressed accordingly. The field map is generated at the beginning of each scan such that a unique field map is generated for each patient. In this manner, the distortions in the magnetic field attributable to the presence of the patient in the image region are corrected.

The magnetic field inhomogeneities cause geometric distortion of the image which is corrected in the geometric distortion correction or interpolation means 104, 106. A chemical shift artifact is actually a type of magnetic field inhomogeneity. The positional difference between the water and lipids may be modeled as being the result of a differnece or inhomogeneity in magnetic field strength at each point. This chemical shift difference in the frequency causes the lipids to be imaged at a shifted location in the frequency encoding direction relative to the water. That is, the lipid image and the water image are offset from each other in the frequency encoding direction. One technique for correcting this is to geometrically shift one of the water or lipid images with a geometrical shift means 108 which brings the images back into coincidence.

Various image represnstations may be extracted and displayed. First, an adding means 110 adds the shift corrected water and lipid images and store the sum in an image memory 112 for display on a display means 114. Further, the geometric distortion corrected real image is stored in a real image memory 116 which is selectively accessed for display on the display means 114. Similarly, the geometric distortion corrected imaginary image is stored in an imaginary image memory 118 for selective display on the display means 114. One of the real and imaginary images, of course, represents water and the other lipids. Further, various intermediate images and determinations have diagnostic utility.

The field map 102 with a patient in the image region is stored in a field map image memory 120 for selective display on the display means. A reference field map memory 122 stores a field map generated with no patient in the image region. A difference means 124 substracts the patient and reference field maps to provide a difference field map 126 which is indicative of the magnetic susceptibility of the patient. The difference field map is connected with the display means for selectively providing a display of the magnetic susceptibility of the patient.

An alternate one scan magnetic field susceptibility corrected imaging technique is illustrated in FIG. 3. The magnetic field information is phase encoded as in the above described technique. This again phase encodes the chemical shift data. Because this data contains chemical shift information, it will approximately correct for noticable parts of the chemical shift artifact. A phase map means 84' derives a phase map or images from the phases of the real and imaginery images 72', 74'. The phase map which is indicative of field inhomogeneity is transformed by an inverse transform means 100' into a field map memory 102'. In the preferred embodiment, the inverse transform is similar to the Sekihara transform discussed above but is based only on the phase. In the Sekihara transform, the intensity can be spread between several pixels due to the shift in the frequency encoding direction. This spread is eliminated with the phase only inverse transform because the phase is not spread between pixels in the same manner as intensity or magnitude.

A magnitude means 130 combines the magnitude or intensity components from each pixel value of the real and imaginary images and discards the phase components. A geometric distortion correction or interpolation means 104' corrects the magnitude image for geometric distortion including chemical shift in accordance with the field map 102'. The corrected image is stored in an appropriate image memory 112' for display on an appropriate monitor or display means 114'. Optionally, the field map may be selectively displayed.

FIG. 4 is illustrative of an improved two scan water/lipid separation technique. A first scan is conducted with $\epsilon=0$. The resonance signals from the first scan are transformed into a real and imaginary image pair for storage in first image memories 72" and 74". A second or reference scan is conducted with $\epsilon=\pi$. The resonance signals from the second scan are transformed into a second real and imaginary image pair and stored in second or reference image memories 76" and 78". A phase image means 80" derives a phase image for the phase components of the reference image pair. Phase discontinuities are unwrapped by a phase unwrapping means 82" to create a phase map for storage in a phase map memory means 84". The phase components of the pixel values of the second image pair are rotated by a phase rotating means 88" in accordance with the distortion indicated by the phase map 84" to create phase rotated second real and imaginary images 90" and 92". A first complex image combining means 140 adds and subtracts the first and second real images to generate and a sum real image for storage in a sum real image memory 142 and a difference real image for storage in a difference real image memory 144. Analogously, a second complex image combination means 150 additively and subtractively combines the two imaginary images to form a sum imaginary image for storage in a sum imaginary image memory 152 and difference image for storage in a difference imaginary image memory 154.

The summed real and imaginary images are combined and scaled, e.g. divided by two, by a summed image combining means 160. Analogously, the difference real and imaginary images are added and scaled by two by an imaginary image combining means 162.

Optionally, the sum and difference images may be corrected for geometric distortion. An inverse transform 100" converts the phase map 84" into a field map 102". The field map may be stored in a field map image memory 120" for display on a display means 112".

A geometric distortion correction means 104" and 106" geometrically correct the sum and difference images for storage in image memories 164 and 166 for display on the display means 112". The sum image represents water and the difference image represents lipids. Of course, the geometric distortion may be omitted with a corresponding decline in image quality.

Figure 5:
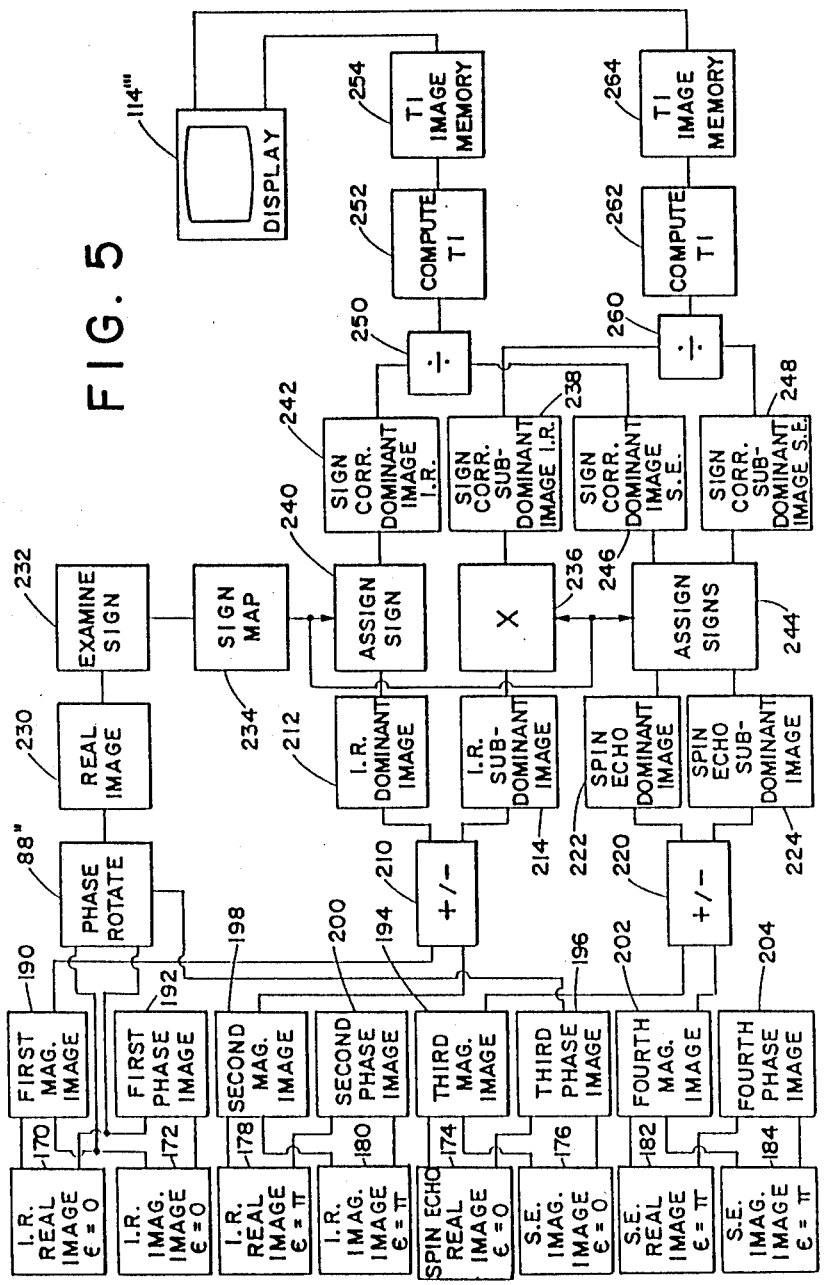
FIG. 5 is a diagrammatic illustration of another embodiment of a two scan image processing apparatus in which relaxation parameter images are generated; and, FIG. 6 is a diagrammatic illustration of another embodiment in which pixel values are sorted on the basis of measured relaxation values into water and lipid images.

With reference to FIG. 5, by unwrapping phase ambiguities, images representing T1 relaxation time are generated. Four cans are performed. An inversion recovery and normal scan with $\epsilon=0$ and an inversion recovery and normal scan with $\epsilon=\pi$ are performed.

The resonance data is transformed from the first inversion recovery scan with $\epsilon=0$ into a first real and imaginary image pair for storage in first image memories 170, 172. Resonance data for the normal scan with $G=0$ are transformed into a second image pair for storage in second memories 174, 176. Resonance signals from the inversion recovery scan with $\epsilon=\pi$ are transformed into a second image pair for storage into second image memories 178, 180. Resonance signals from the normal scan echo with $\epsilon=\pi$ are transformed into a fourth real and imaginary image pair for storage in fourth memories 182 and 184.

Magnitude and phase reconstructions are performed on each image pair to generate a magnitude image and a separate phase image. Specifically, the $\epsilon=0$ inversion recovery magnitude image is generated and stored in a first magnitude image memory 190 and a first phase image is generated and stored in a memory 192. The $\epsilon=0$, normal scan image pair are reconstructed into a second magnitude image for storage in a second magnitude image memory 194 and a second phase image for storage in a third phase image memory 96. Analogously, the $\epsilon=\pi$ inversion recovery image pair is converted into a third magnitude image for storage in a third magnitude image memory 198 and a third phase image for storage in a third phase image memory 200. The $\epsilon=\pi$ normal scan image pair is reconstructed into a fourth magnitude image for storage in a fourth magnitude image memory 202 and a fourth phase image for storage in a fourth phase image memory 204.

The sum or dominant images and the difference or subdominant images are formed and saved from the inversion recovery scan pair and the normal scan pair. Specifically, the magnitudes from inversion recovery memories 190 and 198 are summed by a first combining means 210 to form a dominant first echo for storage in a first echo dominant image memory 212. The first combining means subtracts to the two magnitude images to generate a inversion recovery subdominant image for storage in a inversion recovery subdominant image memory 214. Analogously, a second combining means 220 sums the normal magnitude images from memories 194 and 202 to generate a dominant second echo image for storage in a normal dominant image memory 222 and subtracts the two magnitude images to generate a subdominant normal image for storage in a normal subdominant image memory 224.

The pixel values of the dominant and subdominant images are corrected for sign ambiguity. Specifically, a phase rotation means 88''' rotates the phase component of the inversion recovery $\epsilon=0$ real and imaginary images from memories 170 and 172 in accordance with the phase image from the normal scan, $\epsilon=0$ memory 196. The rotated real image in a corrected real image memory 230 is used to determine the proper sign for each pixel value of the dominant and subdominant magnitude images. That is, a sign adjusting means assigns pixel values coresponding to each pixel of memory 230 which is positive im memory 230 a positive sign and assigns each pixel which corresponds to a negative pixel a negative sign.

A sign map generating means 232 assigns a $+1$ to each pixel of a sign map memory 234 which corresponds to a positive pixel of the image in memory 230 and a $-1$ for each pixel of the sign map which corresponds to a negative pixel in image 230. A multiplying means 236 multiplies the sign map 234 by the subdominant image to generate a subdominant image with proper sign for storage in a memory 238. Analogously, a sign assigning means 240 corrects the sign of the dominant image to produce a sign corrected dominant image 242. Another sign assigning means 244 makes the same sign assignments in the normal dominant and subdominant images to generate normal sign corrected dominant and subdominant images 246 and 248, respectively.

The T1 relaxation time varies as a known function of the ratio of inversion recovery and normal scan dominant or subdominant images. A first dividing means 250 determines the ratio of the first and second dominant images pixel by pixel. A first T1 computing means 252 converts the ratio into a representation of T1 relaxation time for storage in a corresponding pixel of a first T1 image memory 254. Analogously, a second dividing means 260 determines the ratio of the inversion recovery and normal scan subdominant images pixel by pixel. A second T1 computing means 262 converts the ratio for each pixel into a representative of T1 relaxation time. The T1 representatives are each stored in a corresponding pixel of a second or subdominant T1 image memory 264. A display means 114''' selectively displays the T1 images. Optionally, the T1 images may be stored, e.g. on tape or in memory, for later processing.

Figure 6:
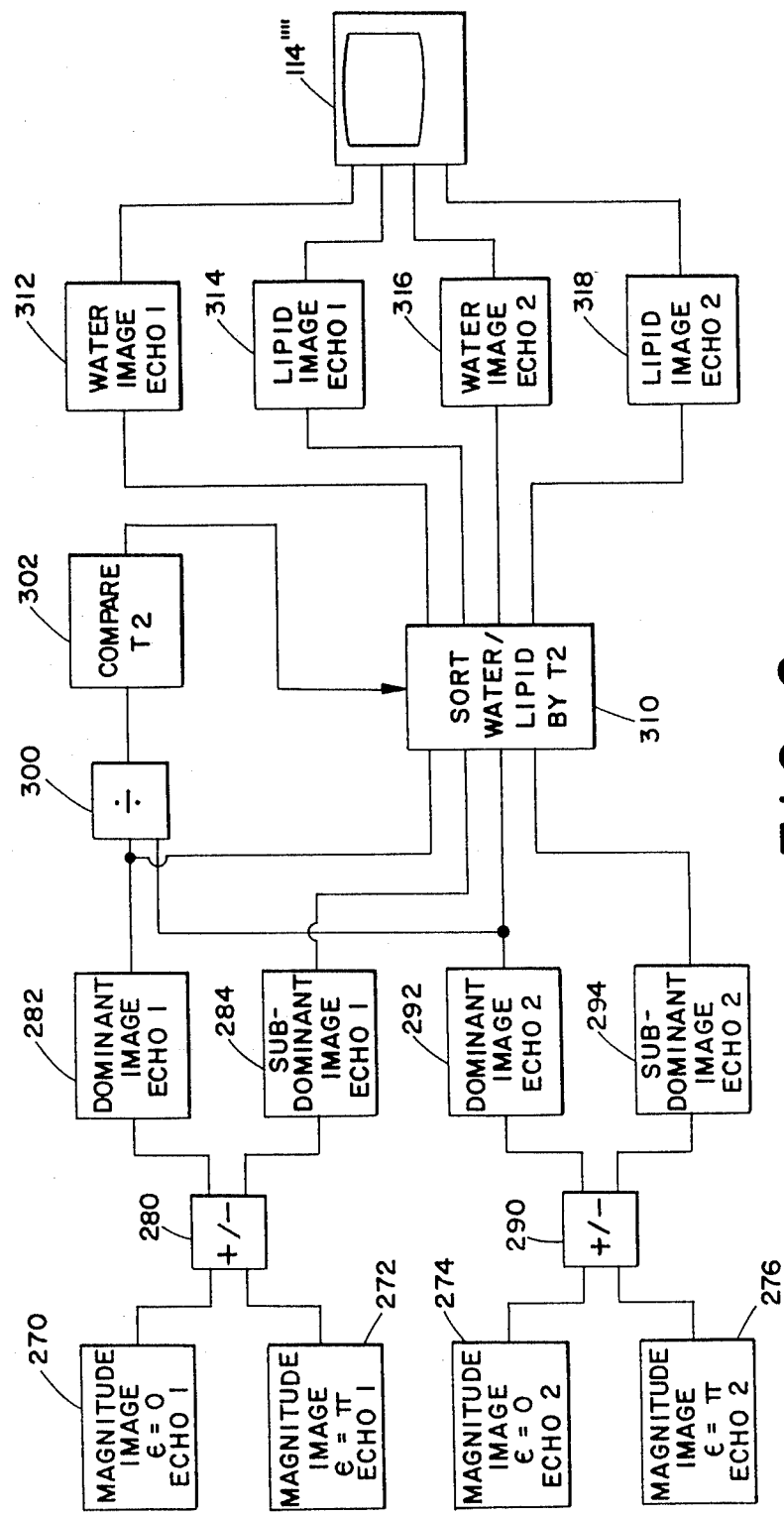

In the embodiment of FIG. 1B, the water and lipid images generated in an inversion recovery sequence are separated by collecting the resonance signals when the water and lipid magnetizations are 90° out of phase. FIG. 6 illustrates an alternate two scan technique for separating the water and lipid images. In the FIG. 6 embodiment, water and lipid values are generated for each pixel but are intermixed between two images. The pixel values are sorted into separate water and lipid images based on the distinct difference in the T2 relaxation times of water and lipid.

Four magnitude images are created. A first magnitude image memory 270 stores a magnitude image which corresponds to the first echo with $\epsilon=0$; a second magnitude memory 272 stores a first echo, $\epsilon=\pi$ magnitude image; a third magnitude image memory 274 stores a second echo, $\epsilon=\pi$ magnitude image; and a fourth magnitude image memory 276 stores a second echo, magnitude image. A first combining means 280 sums and subtracts the first echo $\epsilon=0$ and $\epsilon=\pi$ images to create a first echo dominant image 282 and a first echo subdominant image 284, respectively. A second combining means 290 adds and subtracts the second echo images to create second echo dominant and subdominant images 292 and 294, respectively. The magnitude of each pixel of the dominant images represents the strength of the signal from the dominant component in the corresponding area of the patient. The magnitude of the corresponding pixel of the subdominant memories represents the other of the water and lipid components.

The decrease in the corresponding pixel magnitudes form the first echo to the second echo is indicative of the T2 relaxation time. A ratio means 300 determines the ratio of corresponding pixel magnitudes, which ratio is indicative of T2 relaxation. A comparing means 302 compares the ratio or computed T2 relaxation value with the corresponding range for lipids. In the preferred embodiment, the ratio means takes the ratio of dominant image pixels, although subdominant images may be compared analogously.

A sorting means 310 sorts the pixel values of the first echo dominant and subdominant images between first echo water and lipid image memories 312 and 314, respectively, and sorts the second echo dominant and subdominant images between second echo water memory 316 and lipid memory 318. Specifically, when the ratio indicates a T2 value in the lipid range, the magnitude values of the corresponding dominant image pixel are moved to the corresponding pixel of the lipid image. The corresponding pixel value of the subdominant image is moved to the water image. Conversely, when the ratio indicates a T2 value outside of the lipid range, the corresponding dominant image pixel value is moved to the water image and the corresponding pixel value of the subdominant image is moved to the lipid memory. In this manner, magnitudes which decrease between echoes in accordance with the lipid T2 relaxation rate are assigned to the corresponding lipid image and the other pixel values are assigned to the water corresponding water image. The water and lipid images are selectively displayable on a display means 114'''.

The invention has been described with reference to the preferred embodiment. Obviously, modifications and alterations will occur to others upon reading and understanding the preceding detailed description of the preferred embodiments. It is intended that the invention be construed as including all such alterations and modifications in so far as they come within the scope of the appended claims or the equivalents thereof.

Having thus described a preferred embodiment, the invention is now claimed to be:

1. A method of generating both a water image and a lipid image with a single magnetic resonance scan, the method comprising:

exciting magnetic resonance in water and lipid dipoles of an image region such that magnetic resonance signal components are generated thereby;

inverting spin magnetization of the resonating dipoles to cause a magnetic resonance echo, the inversion being timed such that water and lipid spin magnetizations are $n\pi \pm 90°$ out of phase during the echo, when n is an integer;

collecting magnetic resonance signal components adjacent the echo, whereby the $n\pi \pm 90°$ out of phase spin magnetizations corresponding to water and lipid are independent;

transforming the collected echo magnetic resonance signal components into a set of pixel values;

dividing the pixel values between a real image and an imaginary image, one of which is the water image and the other of which is the lipid image, whereby collecting data with the $n\pi \pm 90°$ out of phase spin magnetizations enables independent water and lipid images to be collected concurrently during a single scan.

2. A method of magnetic resonance imaging comprising:

exciting magnetic resonance in water and lipid dipoles of an image region such that magnetic resonance signal components are generated thereby;
causing a first magnetic resonance echo;
collecting magnetic resonance signal components adjacent the first echo;
transforming the collected first echo magnetic resonance signal components into a first set of pixel values;
repeating the exciting, echo causing, collecting, and transforming step with the spin magnetization inversion step time shifted to generate a second set of pixel values;
additively combining the first and second pixel value sets to create a dominant pixel value set representing a dominant one of the water and lipid dipoles at each corresponding image region location and subtractively combining the first and second pixel value sets to create a subdominant pixel value set representing a subdominant one of the water and lipid dipoles at the corresponding image region locations;
sorting (i) the dominant set pixel values corresponding to water dominant image region locations into a water image, (ii) the dominant set pixel values corresponding to lipid dominant image region locations into a lipid image, (iii) the subdominant set pixel values corresponding to water dominant image region locations into the lipid image, and (iv) the subdomant set pixel values corresponding to lipid dominant image region locations into the water image.

3. A method of magnetic resonance imaging comprising:

exciting magnetic resonance in water and lipid dipoles of an image region such that magnetic resonance signal components are generated thereby;
inverting spin magnetization of the resonating dipoles to cause a first echo;
collecting magnetic resonance signal components adjacent the first echo;
transforming the collected first echo magnetic resonance signal components into a first set of pixel values;
after the step of collecting magnetic resonance signals adjacent the first echo repeating the inversion step and collecting magnetic resonance signal components adjacent a second echo and transforming the collected second echo magnetic resonance signal components into second echo pixel values;
deriving first echo dominant and subdominant pixel value sets and at least one of a second echo dominant and subdominant pixel value set; and,
determining a relaxation time parameter corresponding to each of the image region locations from a variation in pixel values between the second echo set and one of the first echo dominant and subdominant pixel value sets, comparing the determined relaxation time parameter with a preselected parameter range corresponding to one of lipid and water, and sorting the pixel values of the first echo dominant and subdominant pixel value sets between water and lipid images in accordance with the comparison.

4. A method of magnetic resonance imaging comprising:

(a) exciting magnetic resonance in water and lipid dipoles in an image region such that magnetic resonance signal components are generated:
(b) spatially encoding the magnetic resonance signal components;
(c) transforming the spatially encoded resonance signal components into a first image corresponding to water dipole generated resonance signal components and a second image corresponding to the lipid dipole generated resonance signal components;
(d) generating a phase map from transformed resonance signals;
(e) inverse transforming the phase map to create a field map;
(f) interpolating at least one of the images in accordance with the field map, whereby the image is corrected for geometric distortion attributable to magnetic field inhomogeneities caused by static, gradient, and local field errors.

5. The method as set forth in claim 4 wherein the exciting step includes exciting the water and lipid dipoles to resonate out of phase; and, further including the step of phase sensitively detecting the resonance signal components such that the transforming step includes transforming the phase sensitively collected resonance signal components into real and imaginary images, the first and second images being the real and imaginary images.

6. The method as set forth in claim 4 further including the steps of:

generating a generally uniform, main magnetic field longitudinally through the image region;
selectively generating shimming magnetic fields in the image region to increase the uniformity of the main magnetic field;
measuring uniformity of at least part of one of the first and second imagings; and,
automatically adjusting the shimming fields such that the measured image uniformity is improved.

7. The method as set forth in claim 4 further including repeating steps (a) through (d) with and without a patient in the image regions to generate a patient field map and a reference field map;

subtractively combining the patient and reference field maps to generate a difference field map indicative of magnetic susceptibility of the patient.

8. The method as set forth in claim 4 wherein the exciting step includes:

applying an excitation pulse, applying an inversion pulse about a time $t\pm\epsilon$ later, and collecting the resonance signal components during an echo about a time $2t$ after the excitation pulse, the collected resonance signal components being transformed into the first and second images, where $0 \leq \epsilon < t$;
applying another excitation pulse, applying another inversion pulse a time $t \pm n\pi$ later, and collecting the resonance signal components about a time $2t$ after the excitation pulse, the collected components being transformed into reference images, where n is an integer;
generating a phase map from the reference images; and,
inverse transforming the phase map to create the field map.

9. A method of magnetic resonance imaging comprising:

(a) exciting magnetic resonance in water and lipid dipoles in an image region by applying an excitation pulse such that magnetic resonance signal components are generated;

(b) applying an inversion pulse a time t later to cause a magnetic resonance echo about a time 2t later;

(c) collecting the resonance signal components during the echo about the time 2t after the excitation pulse;

(d) spatially encoding the magnetic resonance signal components;

(e) transforming the collected resonance signal components being transformed into a first image;

(f) repeating the excitation step by applying another excitation pulse, applying another inversion pulse a time $t \pm \epsilon$ after the excitation pulse, and collecting the resonance signal components about a time 2t later, the collected components being transformed into a second image, where $\epsilon \neq 0$ and $t < \epsilon < t$;

(g) interpolating at least one of the images in accordance with a field map which is indicative of magnetic field inhomogeneities in the image region, whereby the image is corrected for geometric distortion attributable to magnetic field inhomogeneities caused by static, gradient, and local field errors.

10. A method of magnetic resonance imaging comprising:

exciting magnetic resonance in water and lipid dipoles in an image region such that magnetic resonance signal components are generated;

spatially encoding the magnetic resonance signal components;

transforming the spatially encoded resonance signal components into a first image corresponding to water dipole generated resonance signal components and a second image corresponding to the lipid dipole generated resonance signal components;

generating a phase image from transformed magnetic resonance signals;

phase unwrapping the phase image to remove ambiguities caused by the water and lipid resonance signal components dephasing by $2n\pi$ radians, where n is an integer;

interpolating at least one of the first and second images in accordance with a field map which is indicative of magnetic field in homogeneities in the image region, whereby the first and second image is corrected for geometric distortion attributable to magnetic field inhomogeneities caused by static, gradient, and local field errors.

11. The method as set forth in claim 10 wherein the unwrapping step includes examining values of pixels in each column in the phase image for discontinuous phase changes of $\pm 2\pi$ in magnitude and changing the phase of all pixel values from a detected polarity change to an end of the column by $2n\pi$ to restore continuity.

12. The method as set forth in claim 11 wherein the unwrapping step further includes examining values of pixels in each row of the phase image for discontinuous phase changes of $\pm 2\pi$ in magnitude and changing the phase of all pixel values from the detected polarity change to one end of the row by $\pm 2\pi$.

13. The method as set forth in claim 12 further including estimating phase changes in regions of the phase image in which the pixel values are close to zero.

14. The method as set forth in claim 13 wherein the estimating step includes interpolating from phase changes in adjacent columns and rows.

15. The method as set forth in claim 14 wherein the estimating step includes tracking of phase change from the last region of sufficient signal strength to the next region of sufficient signal strength.

16. A method of magnetic resonance imaging comprising:

(a) generating a generally uniform, main magnetic field longitudinally through an image region;

(b) applying magnetic field gradients in the image region for spatially encoding resonance signal components;

(c) applying an excitation radio frequency pulse for exciting magnetic resonance of at least water and lipid dipoles in the image region, the water and lipid dipoles resonate at different frequencies such that the respective spin magnetizations thereof progressively dephase, i.e. become progressively more out of phase;

(d) applying an inversion pulse such that the dephasing spin magnetizations commence rephasing;

(e) phase sensitively detecting the resonance signal components when the rephasing spin magnetizations are about a $n\pi \pm \pi/2$ degrees out of phase, where n is an integer;

(f) transforming the detected resonance signal components into real and imaginary images, one image corresponding to resonance signals generated by the water dipoles and the other image corresponding to resonance signal components generated by the lipid dipoles.

17. The method as set forth in claim 16 further including the steps of:

selectively generating shimming magnetic fields in the image region to increase the uniformity of the main magnetic field;

generating a phase map from at least some of the transformed magnetic resonance signals;

measuring uniformity of the phase map; and, automatically adjusting the shimming fields such that the measured image uniformity is improved.

18. The method as set forth in claim 16 further including:

generating a reference image pair;

deriving a phase image from the reference image pair; and, unwrapping the phase of the phase image to remove ambiguities caused by water an dlipid resonance signal components dephasing by $2n\pi$ radians, where n is an integer to create an ambiguity corrected phase map.

19. The method as set forth in claim 18 wherein the unwrapping step includes:

examining values of pixels in each column of the phase image for discontinuous phase changes and changing the phase of all pixel values from the detected change to one end of the column by $\pm 2\pi$; and, examining values of pixels in each row of the phase image for discontinuous phase changes and changing the phase of all pixel values from the detected phase discontinuity change to one end of the row by $2\pi$.

20. The method as set forth in claim 19 further including estimating the occurrence of discontinuous phase changes in regions of the image in which the pixel values are close to zero.

21. The method as set forth in claim 16 further including:
   generating a reference image pair;
   deriving a phase map from the reference image pair;
   inverse transforming the phase map to create a field map which is indicative of magnetic field distortion; and,
   interpolating pixel values of at least one of the real and imaginary images in accordance with the field map to correct for magnetic field distortion.

22. The method as set forth in claim 16 further including:
   generating a phase map from the real and imaginary images;
   inverse transforming the phase map to create a field map which is indicative of magnetic field distortion; and,
   interpolating pixel values of at least one of the images in accordance with the field map to compensate for the magnetic field distortion.

23. A method of magnetic resonance imaging comprising:
   (a) exciting magnetic resonance in dipoles in an image region such that magnetic resonance signal components are generated;
   (b) transforming the magnetic resonance signal components into at least a first image representation, the first image representation including a rectangular array of complex image values the rectangular array defining a plurality of pixel columns in one direction and a plurality of pixel rows in another direction;
   (c) examining the image values in each row for discontinuous phase changes of $\pm n\pi$ radians, where n in an integer greater than zero; and,
   (d) changing the phase of the image values from the detected phase discontinuities to an end of the row by $2\pi$ to restore continuity.

24. The method as set forth in claim 23 further including:
   examining the image values in each column for phase discontinuities; and,
   changing the phase of the image values from the detected phase discontinuity to an end of the column by $2\pi$.

25. The method as set forth in claim 24 further including estimating phase discontinuities in regions of the image in which the pixel values are close to zero.

26. A method of magnetic resonance imaging comprising:
   (a) generating a generally uniform, main magnetic field longitudinally through an image region;
   (b) selectively generating shimming magnetic fields in the image region to increase the uniformity of the main magnetic field;
   (c) exciting magnetic resonance of selected dipoles in the image region such that magnetic resonance signals are generated;
   (d) spatially encoding the magnetic resonance signals;
   (e) transforming the spatially encoded magnetic resonance signals and creating a phase image representation;
   (f) measuring image uniformity in at least a preselected portion of the phase image representation; and,
   (g) automatically adjusting the shimming fields to optimize the measured phase image uniformity.

27. A method of measuring magnetic susceptibility of a patient, the method comprising:
   (a) exciting magnetic resonance in dipoles in an image region such that magnetic resonance signal components are generated;
   (b) spatially encoding the magnetic resonance signal components;
   (c) transforming the spatially encoded magnetic resonance signal components into a first image pair;
   (d) deriving a phase image from phase components of the image pair;
   (e) removing phase discontinuities from the phase image to create a phase map;
   (f) inversely transforming the phase map to create a reference field map;
   (g) repeating steps (a) through (f) with a patient in the image region to create a patient field map;
   (h) subtracting the patient and reference field maps to derive a difference field map indicative of patient susceptibility.

28. A method of magnetic resonance imaging comprising:
   (a) applying a magnetic resonance excitation pulse;
   (b) applying an inversion pulse a time $t \pm \epsilon$ after the excitation pulse;
   (c) collecting magnetic resonance signals around a first echo about a time 2t after the excitation pulse;
   (d) applying a second inversion pulse about a time 3t after the excitating pulse;
   (e) collecting magnetic resonance signals around a second echo about a time 4t after the excitation pulse;
   (f) performings steps (a) through (e) with $\epsilon=0$ and transforming the magnetic resonance signals collected during the first echo into a first image pair and during the second echo into a second image pair;
   (g) performing steps (a) through (e) with $\epsilon \neq 2n\pi$ such that the water and lipid dipoles are placed in a preselected phase relationship, where n is an integer including zero and transforming the magnetic resonance signals collected during the first echo into a third image pair and during the second echo into a fourth image pair;
   (h) deriving first, second, third, and fourth magnitude images from the first, second, third, and fourth image pairs, respectively;
   (i) adding the first and third magnitude images to create a first echo dominant image and adding the second and fourth magnitude images to create a second dominant image; and,
   (j) subtracting the first and third magnitude images to create a first echo subdominant image and subtracting the second and fourth magnitude images to create a second echo subdominant image.

29. The method as set forth in claim 28 further including:
   deriving T2 relaxation rate information for each pixel of the first and second echo dominant and subdominant images;
   sorting pixel values of the first dominant and subdominant images between water and lipid images in accordance with the derived T2 relaxation rate information.

30. The method as set forth in claim 29 wherein the T2 deriving step includes dividing corresponding pixels of one of the dominant and subdominant images.

31. A method of magnetic resonance imaging comprising:
(a) inverting spin magnetization;
(b) exciting magnetic resonance in water and lipid dipoles in an image region such that magnetic resonance signal components are generated;
(c) inverting the spin magnetization of the resonating water and lipid dipoles;
(d) collecting the magnetic resonance signal components around an echo;
(e) performing steps (a) and (b) another time;
(f) performing step (c) another time with the inversion time shifted relative to step (c) such that the resonating water and lpid dipoles are placed in a preselected phase relationship;
(g) performing step (d) another time following the time shifted inversion;
(h) performing steps (b), (c), and (d) another time;
(i) performing steps (b), (f), and (g) another time;
(j) transforming the magnetic resonance signal components collected during steps (d), (g), (h), and (i) into first, second, third and fourth image representations each consisting of magnitude and phase components respectively;
(k) adding the first and second image representation magnitude components to create a first dominant image;
(l) subtracting the first and second image representation magnitude components to create a first subdominant image;
(m) adding the third and fourth image representation magnitude components to create a second dominant image;
(n) substracting the third and fourth image representation magnitude components to create a second subdominant image;
(o) correcting the signs of the first and second dominant and subdominant images;
(p) forming a first T1 relaxation parameter image from the sign corrected first and second dominant images; and,
(q) forming a second T1 relaxation parameter image from the first and second subdominant images.

32. The method as set forth in claim 31 wherein step (p) includes dividing corresponding pixels of the first adn second dominant images to create a first ratio image and calculating a relaxation time parameter therefrom to create the first relaxation parameter image.

33. The method as set forth in claim 32 wherein step (q) includes dividing correspondingpixels of the first and second subdominant images to create a second ratio image and calculating relaxation time parameters therefrom to create the second relaxation parameter image.

34. An apparatus for generating both a water image and a lipid image in a single magnetic resonance scan, the apparatus comprising:
(a) magnetic resonance excitation means for exciting magnetic resonance in water and lipid dipoles of an image region such that magnetic resonance signal components are generated thereby;
(b) spin magnetization inverting means for inverting spin magnetizations of the resonating dipoles to cause an echo, the inversion means inverting the magnetizations such that water and lipid magnetizations are $n\pi \pm 90°$ out of phase during the echo, where n is an integer including zero;
(c) a receiver for receiving magnetic resonance signal components proximate a first echo when the water and lipid magnetizations are $n\pi \pm 90°$ out of phase;
(d) transforming means for transforming the collected first echo magnetic resonance signal components into a first set of pixel values; and,
(e) a separating means for separating real and imaginary components of the pixel values of the first set between a water image and a lipid image whereby the values transformed from the $n\pi \pm 90°$ out of phase magnetizations enables independent water and lipid images to be collected concurrently during a single scan.

35. An apparatus for magnetic resonance imaging comprising:
(a) magnetic resonance excitation means for exciting magnetic resonance in water and lipid dipoles in an image region such that magnetic resonance signal components are generated;
(b) gradient field means for spatially encoding the magnetic resonance signals;
(c) transforming means for transforming the spatially encoded resonance signal components into a first image corresponding to water dipole generated resonance signal components and a second image corresponding to lipid dipole generated resonance signal components;
(d) a means for generating a phase image;
(e) a phase unwrapping means for removing ambiguities in the phase image attributable to water and lipid spin magnetizations that are dephased by at least $2\pi$ radians to create an ambiguity corrected phase map;
(f) inverse transform means for inversely transforming the phase map to create the field map; and,
(g) geometric distortion correction means for interpolating at least one of the images in accordance with the field map.

36. The apparatus as set forth in claim 35 wherein the magnetic resonance excitation means includes:
a main magnetic field generating means for generating a generally uniform, main magnetic field longitudinally through the image region and a shimming magnetic field means for selectively generating shimming magnetic fields in the image region for increasing the uniformity of the main magnetic field; and,
further including a shimming magnetic field adjusting means for measuring the uniformity of at least a portion of an image and automatically adjusting the shim magnetic field means such that the measured image uniformity is optimized.

37. The apparatus as set forth in claim 35 further including:
a reference image means for generating a reference image pair;
a phase map means for generating a phase map from the reference image pair; and,
an inverse transform means for inversely transforming the phase map to create the field map.

38. An apparatus for magnetic resonance imaging comprising:
a main magnetic field means for generating a generally uniform, main magnetic field longitudinally through an image region;

a gradient field means for applying gradient magnetic fields in the image region for spatially encoding the resonance signal components;

a resonance excitation means for selectively exciting magnetic resonance of at least water and lipid dipoles in the image regions, the resonance excitation means including means for applying an excitation radio frequency pulse which induces the water and lipid dipoles to resonate at different resonance frequencies such that the respective magnetizations thereof progressively dephase and an inversion pulse applying means for applying an inversin pulse which inverts the spin magnetizations such that the dephasing spin magnetizations commence rephasing;

a phase sensitive detection means for detecting the magnetic resonance signal components when the rephasing magnetizations are about a preselected angle out of phase; and, transforming means for transforming the detected resonance signal components into real and imaginary images for storage in real and imaginary image memories, one image corresponding to resonance signals generated by the water dipoles and the other image corresponding to dipoles generated by the lipid dipoles.

39. The apparatus as set forth in claim 38 further including:

a shimming magnetic field generating means for selectively shimming magnetic fields in the image region for increasing the uniformity of the main magnetic field; and, a shim magnetic field adjusting means for measuring the uniformity of at least a portion of an image and automatically adjusting the shimming magnetic field means such that the measured image uniformity is optimized.

40. The apparatus as set forth in claim 38 further including:

a phase image means for generating a phase image having phase discontinuities that are attributable to water and lipid spin magnetizations dephasing by at least $2\pi$ radians; and, a phase unwrapping means for changing the phase of values of the phase image to remove the discontinuities and produce a discontinuity free phase map.

41. An apparatus for magnetic resonance imaging comprising:

a magnetic resonance excitation means for exciting magnetic resonance of dipoles in an image region such that magnetic resonance signal components are generated;

a transforming means for transforming the magnetic resonance signal components into at least a first image representation, the image representation including a rectangular array of complex image values which array is defined by a plurality of columns extending in one direction and a plurality of rows extending in another direction; and, a phase unwrapping means for removing phase discontinuities caused by the spin magnetizations dephasing by $2n\pi$ radians.

42. The apparatus as set forth in claim 41 wherein the phase unwrapping means examines the image values in each of the columns and rows of the image for discontinuous phase changes of $2\pi$ and changes the phase of all image values from a detected phase discontinuity change to an end of the respective row and column by $2\pi$.

43. The apparatus as set forth in claim 41 further including:

a main magnetic field generating means for generating a generally uniform, main magnetic field longitudinally through the image region and a shimming magnetic field means for selectively generating shimming magnetic fields in the image region for increasing the uniformity of the main magnetic field; and, further including a shimming magnetic field adjusting means for measuring the uniformity of at least a portion of the image and automatically adjusting the shim magnetic field means such that the measured image uniformity is optimized.

44. An apparatus for measuring patient susceptibility, the apparatus comprising:

a magnetic resonance excitation means for exciting magnetic resonance dipoles in an image region such that magnetic resonance signal components are generated;

a transforming means for transforming the magnetic resonance signal components into image representations;

a phase image means for deriving a phase image from phase components of the image representations;

a phase unwrapping means for removing phase discontinuities from the phase image to create a phase map, whereby the phase map is discontinuity free;

an inverse transform means for inversely transforming the phase map to create a field map;

a reference field map memory means for storing a field map created without a patient in the image region;

a patient field map memory means for storing a representation of a field map created with a patient in the image region;

a field map subtracting means for subtracting the patient and reference field maps to create a difference field amp indicative of the magnetic susceptibility of the patient.

45. An apparatus for magnetic resonance imaging, the apparatus comprising:

a main magnetic field means for generating a generally uniform, main magnetic field longitudinally through an image region;

shimming magnetic field means for selectively generating a shimming magnetic field in the image region for increasing the uniformity of the main magnetic field;

magnetic resonance excitation means for exciting magnetic resonance of selected dipoles in the image region such that magnetic resonance signal components are generated;

gradient field means for generating gradient fields for spatially encoding the magnetic resonance signals;

transforming means for transforming the spatially encoded resonance signals into an image representation;

shimming magnetic field adjustment means for measuring uniformity of at least a preselected portion of the image representation and automatically adjusting the shimming magnetic field means to optimize the measured image uniformity.

46. An apparatus for magnetic resonance imaging comprising:

a magnetic resonance excitation means for exciting magnetic resonance by applying an excitation pulse and an inversion pulse about a time $t\pm\epsilon$ later;

transform means for transforming resonance signals collected about a time 2t after application of the excitation pulse when $\epsilon=0$ for storage in a reference memory means and for transforming resonance signals received about a time 2t after the excitation pulse generated when $0<\epsilon<t$ for storage in a first memory means;

a phase image means for deriving a phase image from the data in the reference memory means;

a phase unwrapping means for removing phase discontinuities from the phase image to generate an ambiguity resolved phase map for storage in a phase map memory means;

inversion transform means for inversely transforming the phase map from the phase map memory means into a field map for storage in a field map memory means; and, a geometric distortion correction means for interpolating image data from the first memory means in accordance with the field map from the field map memory means.

47. An apparatus for magnetic resonance imaging comprising:

a magnetic resonance exciation means for exciting magnetic resonance of at least water and lipid dipoles in an image region by applying a magnetic resonance excitation pulse, a first inversion pulse about a time $t\pm\epsilon$ after the excitation pulse and a second inversion pulse about a time $3t\pm\epsilon$ after the excitation pulse;

a magnetic resonance signal collecting means for receiving magnetic resonance signals around a first echo about a time 2t after the excitation pulse and around a second echo about a time 4t after the excitation pulse;

a transform means for transforming resonance signals collected around the first echo when $\epsilon=0$ into a first memory means, for transforming resonance signals collected adjacent the second echo when $\epsilon=0$ into a second memory means, for transforming resonance signals collected adjacent the first echo when $\epsilon=n\pi$ into a third memory means and for transforming resonance signals collected around the second echo with $\epsilon=n\pi$ into a fourth memory means, where n is an integer;

a magnitude image deriving means for deriving first, second, third, and fourth magnitude images from the first, second, third, and fourth memory means respectively;

a phase image means for deriving phase images from at least some of the first, second, third, and fourth memory means;

a first echo dominant image generating means for generating a first echo dominant image by additively combining the magnitude images corresponding to resonance signals collected during the first echo with $\epsilon=0$ and $\epsilon=n\pi$;

a subdominant image generating means for subtractively combining the magnitude images corresponding to resonance signals collected during the first echo when $\epsilon=0$ and $\epsilon=n\pi$;

a second echo dominant image generating means for generating a second echo dominant image by additively combining the magnitude images corresponding to resonance signals collected during the second echo with $\epsilon=0$ and $\epsilon=n\pi$;

a second subdominant image generating means for subtractively combining the magnitude images corresponding to resonance signals collected during the second echo when $\epsilon=0$ and $\epsilon=n\pi$;

a sign adjusting means for adjusting the sign of pixel values in each of the first and second dominant and subdominant images.

48. The apparatus as set forth in claim 47 further including a ratio means for determining a ratio of corresponding pixel values of the first and second dominant images, which ratios are indicative of a relaxation parameter value; and, a second ratio means for determining a ratio of corresponding pixel values of the first and second subdominant images, which ratios are indicative of relaxation parameter values.

49. A method of magnetic resonance imaging comprising:

exciting magnetic resonance in water and lipid dipoles of an image region such that magnetic resonance signal components are generated thereby;

inverting spin magnetization of the resonating dipoles to cause at least a first magnetic resonance echo;

collecting the magnetic resonance signal components adjcent the first echo;

transforming the collected first echo magnetic resonance signal components into a first set of pixel values;

generating additional sets of pixel values; and, separating water and lipid images from the first and aditional sets of pixel values based on T1 relaxation times.

* * * * *